United States Patent [19]

Takemae et al.

[11] Patent Number: 4,532,613
[45] Date of Patent: Jul. 30, 1985

[54] SEMICONDUCTOR MEMORY DEVICE

[75] Inventors: Yoshihiro Takemae, Yokohama; Tomio Nakano, Kawasaki; Tsuyoshi Ohira, Yokohama, all of Japan

[73] Assignee: Fujitsu Limited, Kawasaki, Japan

[21] Appl. No.: 356,487

[22] Filed: Mar. 9, 1982

[30] Foreign Application Priority Data

Mar. 13, 1981 [JP] Japan .................................. 56-36945

[51] Int. Cl.³ .............................................. G11C 11/40
[52] U.S. Cl. ...................................... 365/230; 365/189
[58] Field of Search ........................ 365/174, 189, 230; 307/270

[56] References Cited

U.S. PATENT DOCUMENTS 4,176,289 11/1979 Leach et al. ..................... 307/270

Primary Examiner—Terrell W. Fears
Attorney, Agent, or Firm—Staas & Halsey

[57] ABSTRACT

In a semiconductor memory device including an output buffer circuit receiving data signals read out from a memory cell array, an output stage MOS transistor being turned ON and OFF according to the output signals of the output buffer circuit, and an output buffer enable (OBE) signal generator circuit for generating an OBE signal which is used as the voltage supply to the output stage of the output buffer circuit, a $V_{BS}$ voltage generator circuit is provided for generating a voltage $V_{BS}$ higher than the voltage source $V_{CC}$ preceding the rising up of the OBE signal, which voltage $V_{BS}$ is used as a voltage supply to the output stage of the OBE signal generator circuit, whereby the OBE signal is formed as a voltage waveform which rises rapidly up to a level higher than the voltage source $V_{CC}$.

7 Claims, 7 Drawing Figures

SEMICONDUCTOR MEMORY DEVICE

BACKGROUND OF THE INVENTION

This invention relates to a semiconductor memory device and especially to an output circuit of a MOS dynamic memory device in which the output level is sufficiently increased.

As shown in FIG. 1, a MOS dynamic memory device generally comprises a sense amplifier circuit SA and a group of column decoders 10 arranged in the center of a semiconductor substrate (chip), as well as a group of memory cells 11; 12 and a group of row decoders 13; 14 arranged on both sides of the semiconductor substrate. In the memory device, a sense buffer circuit 15 is connected to a pair of data buses DB and $\overline{DB}$ leading from the group of column decoders 10, and a data output $D_{out}$ is obtained by a system consisting of a sense buffer circuit 15, an output buffer circuit 16, and a group of output transistors 17. In FIG. 1, $CL_1$ through $CL_n$ indicate output signals of the column decoders 10; $Q_1$ through $Q_{n2}$ indicate gate transistors which are turned on and off by the output signals $CL_1$ through $CL_n$; $BL_1$ through $\overline{BL_n}$ indicate bit lines; and 18 and 19 indicate, respectively, an SBE (sense buffer enable) signal generator and on OBE (output buffer enable) signal generator, the SBE and OBE signals actuating, respectively, the sense buffer circuit 15 and the output buffer circuit 16.

The OBE generator 19, the output buffer circuit 16, and the group of output transistors 17 of the device of FIG. 1 are illustrated in detail in FIG. 2. As shown in FIG. 2, the OBE generator 19 consists of MOS transistors $Q_{11}$ through $Q_{22}$, the output buffer circuit 16 consists of MOS transistors $Q_{31}$ through $Q_{34}$, and the group of output transistors 17 consists of MOS transistors $Q_{41}$ and $Q_{42}$. The transistors $Q_{11}$ through $Q_{22}$, $Q_{31}$ through $Q_{34}$, and $Q_{41}$ and $Q_{42}$ are connected between the voltage sources $V_{CC}$ and $V_{SS}$. In FIG. 2, N1 through N5 and N11 and N12 indicate nodes, and RST indicates a reset signal.

The operation of the circuit in FIG. 2 will be described with reference to FIG. 3, in which various waveforms of the voltages of signals appearing in the circuit are illustrated.

At first, when the SBE signal from the signal generator 18 rises up, the sense buffer circuit 15 is actuated and starts to operate to turn one of the outputs RD and $\overline{RD}$ to the "H" level and the other output to the "L" level in accordance with the read-out data from the data buses DB and $\overline{DB}$. In the case of FIG. 3, it turns the output RD to the "H" level and the output $\overline{RD}$ to the "L" level. The output buffer circuit 16 receives the signals OBE, RD, and $\overline{RD}$, and in the circuit 16, according to the signal RD, the transistor $Q_{34}$ is turned ON and the transistor $Q_{33}$ is turned OFF. Therefore, one output OUT rises up in accordance with the rising up of the signal OBE and the other output $\overline{OUT}$ remains at the "L" level.

In the group of output transistors 17 receiving the output signals OUT and $\overline{OUT}$, the transistor $Q_{41}$ is turned ON, the transistor $Q_{42}$ is turned OFF, and, accordingly, the output signal $D_{out}$ is turned to the "H" level.

In the above-mentioned memory device, the "H" level of the output signal OBE from the signal generator is almost equal to the level of the voltage source $V_{CC}$ due to the bootstrap effect produced by the MOS capacitor $Q_{19}$. Accordingly, even though this "H" level of the output signal OBE may be transmitted directly to the output signal OUT or $\overline{OUT}$ of the output buffer circuit 16 by means of the bootstrap effect of the gate capacitance of the transistor $Q_{33}$ or $Q_{34}$, the maximum level of the signals OUT, $\overline{OUT}$ is that of the voltage source $V_{CC}$. Therefore the level of the final output signal $D_{out}$ becomes less than the voltage source $V_{CC}$, at least by the threshold level $V_{TH}$ of the transistor $Q_{41}$. Though it is necessary that the "H" level $V_{OH}$ of the final output $D_{out}$ be higher than 2.4 V under the condition that the load current of the predetermined value is flowing, it may be difficult to fulfill the above-mentioned requirement in any case in accordance with the circuit of FIG. 2. For example, assuming that the voltage source is $V_{CC}=4.5$ V and the threshold level of the transistor $Q_{41}$ is $V_{TH}=1.0$, the maximum level of the output $D_{out}$ is less than $(V_{CC}-V_{TH})=3.5$ V, and when the load current increases the level of the output $D_{out}$ decreases to less than 3.5 V so that it may be less than 2.4 V. In such a situation, the rising up of the output $D_{out}$ is slow, as shown in FIG. 3, and, accordingly, the access time of the memory device increases.

SUMMARY OF THE INVENTION

An object of the present invention is to improve the above-mentioned problem in the memory device of the prior art and to provide a semiconductor memory device in which the level of the output buffer enable signal OBE is increased so that the "H" level of the signals OUT, $\overline{OUT}$ is increased, resulting in a higher output level $V_{OH}$ and a shorter access time.

In accordance with the present invention, there is provided a semiconductor memory device which comprises an output buffer circuit receiving data signals read out from a memory cell array, output stage MOS transistors being turned ON and OFF according to the output signals of said output buffer circuit, and an OBE signal generator circuit for generating the OBE signal which is used as a voltage supply for the output stage of said output buffer circuit. A $V_{BS}$ voltage generator circuit is also provided for generating a voltage $V_{BS}$ higher than the voltage source $V_{CC}$ preceding the rising up of said OBE signal, said voltage $V_{BS}$ being fed as a voltage supply to the output stage transistors of said OBE signal generator circuit, said OBE signal being formed as a voltage waveform which rises rapidly up to a level higher than the voltage source $V_{CC}$.

DESCRIPTION OF THE PREFERRED EMBODIMENTS

A semiconductor memory device according to the present invention will be described in detail with reference to the accompanying drawings.

Figure 1:
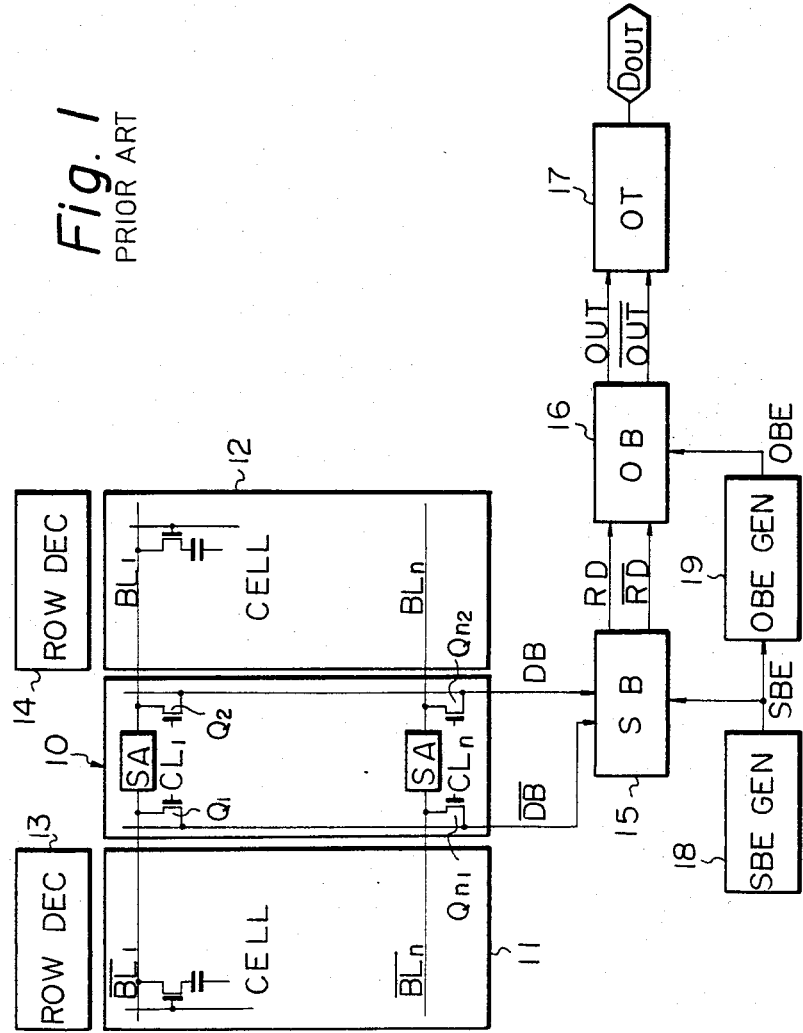
FIG. 1 is a block diagram of a MOS dynamic memory device of the prior art.
Figure 4:
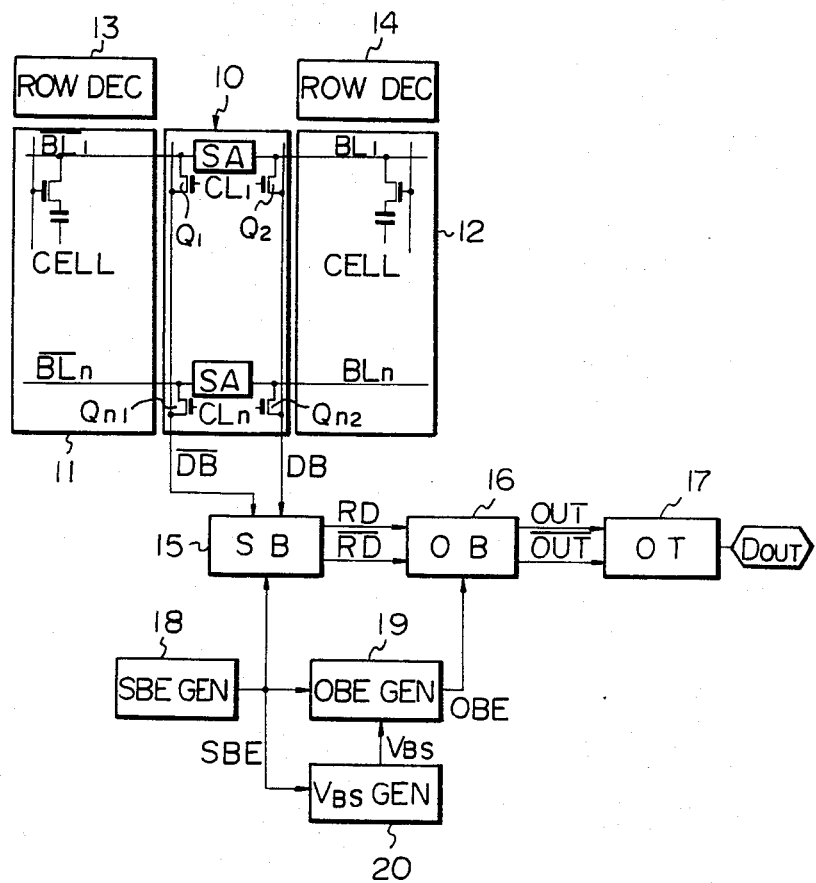
FIG. 4 is a block diagram of a semiconductor memory device in accordance with one embodiment of the present invention.

A MOS dynamic memory device according to the present invention is illustrated in FIG. 4. The memory device of FIG. 4 has the same construction as the device of FIG. 1 except that it further comprises a $V_{BS}$ voltage generator circuit 20 for generating a voltage signal $V_{BS}$ higher than the voltage source $V_{CC}$, the voltage signal $V_{BS}$ being used as a voltage supply to the output stage of the OBE signal generator circuit 19 instead of the voltage source $V_{CC}$.

Figure 5:
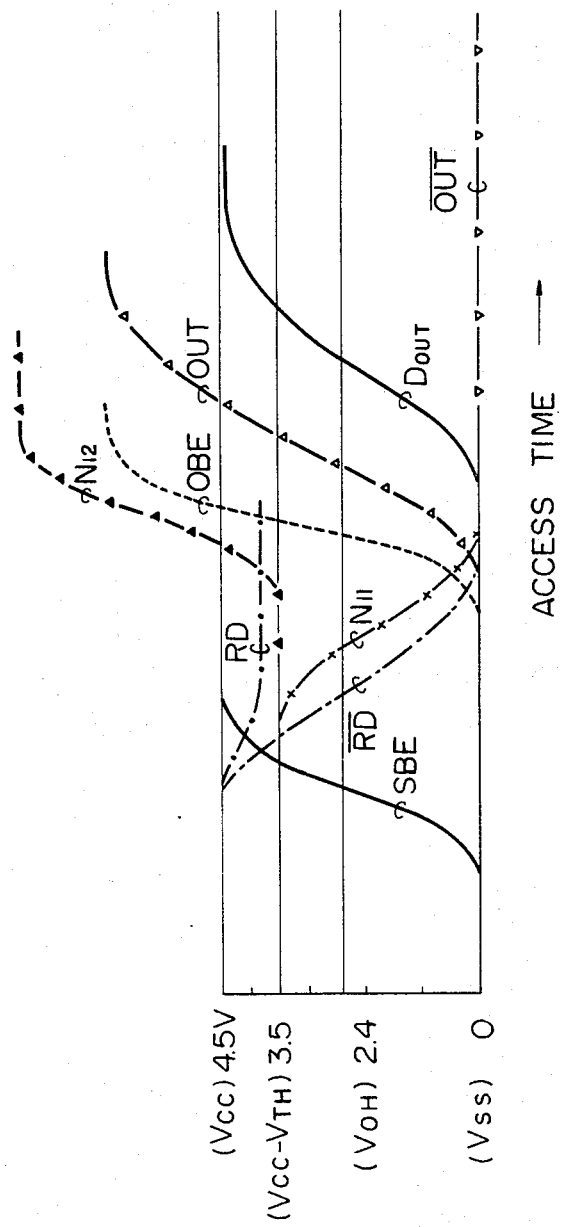
FIG. 5 illustrates various voltage waveforms explaining the operation of the device of FIG. 4.

Various voltage waveforms in the device of FIG. 4 are illustrated in FIG. 5 to explain the operation of the memory device according to the present invention. As shown in FIG. 5, in the device according to the present invention, the signal OBE rises up rapidly to a level higher than the voltage source $V_{CC}$. Accordingly, the output OUT of the buffer circuit 16 also rises up above the voltage source $V_{CC}$, and therefore the final output $D_{out}$ rises up rapidly almost to the level of the voltage source $V_{CC}$. Thus, the output signal $D_{out}$ becomes sufficiently higher than the required "H" output level $V_{OH} = 2.4$ V and the access time of the memory device becomes shorter due to the decrease in rising time.

Figure 6:
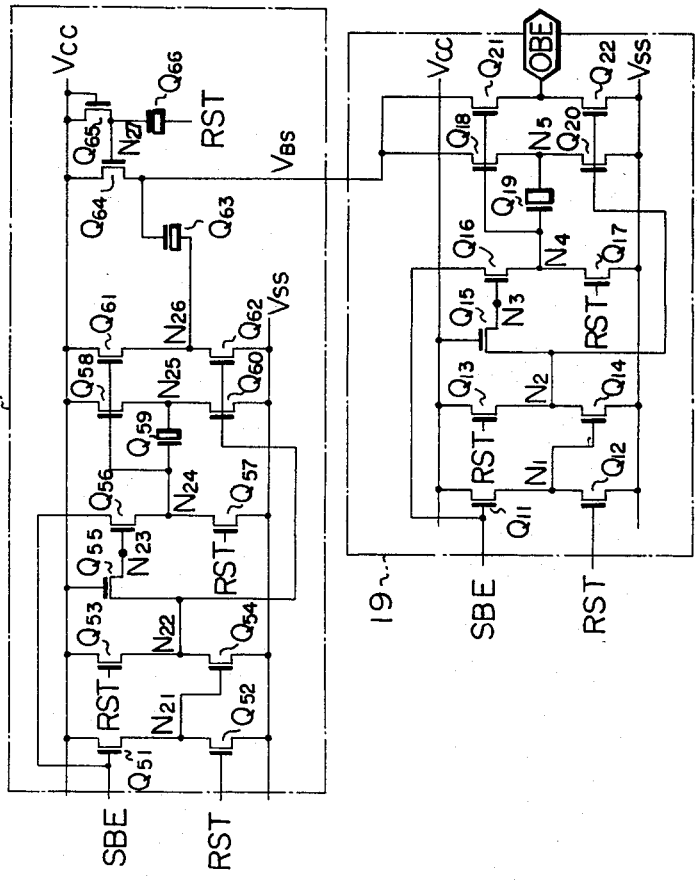
FIG. 6 is a detailed circuit diagram of the OBE signal generator circuit and the $V_{BS}$ voltage generator circuit in the device of FIG. 4.

The detailed circuit diagram of the OBE signal generator circuit 19 and the $V_{BS}$ voltage generator circuit 20, by which circuits the above-mentioned operation of the memory device is realized, is illustrated in FIG. 6. The OBE signal generator circuit 19 of FIG. 6 has the same construction as that of FIG. 2 except that the output stage transistors $Q_{18}$ and $Q_{21}$ are connected to the output of the voltage generator circuit 20 instead of the voltage source $V_{CC}$, in which circuit 20 the voltage $V_{BS}$ rises up higher than the voltage source $V_{CC}$. The voltage generator circuit 20 comprises MOS transistors $Q_{51}$ through $Q_{66}$ which are interconnected between the voltage sources $V_{CC}$ and $V_{SS}$ as shown in FIG. 6. In FIG. 6, N21 through N27 indicate nodes.

Figure 7:
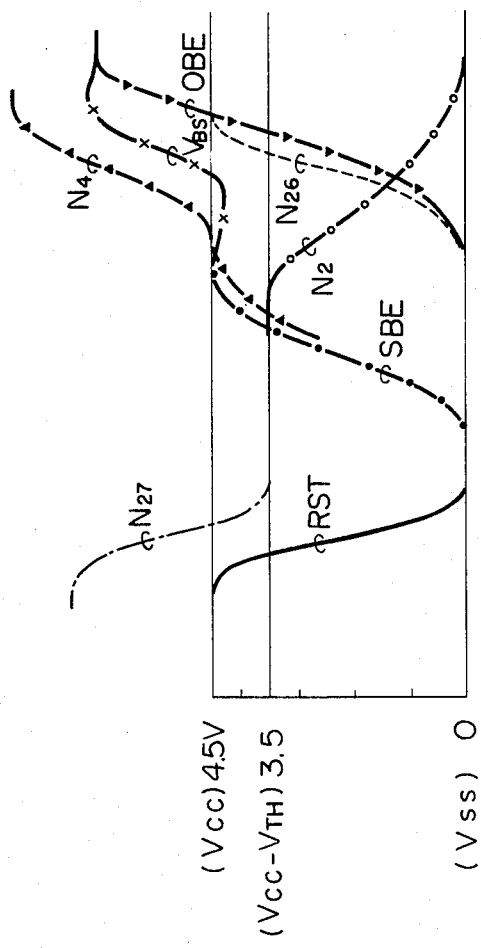
FIG. 7 illustrates various voltage waveforms appearing in the circuit of FIG. 6.

The operation of the circuit of FIG. 6 will be described with reference to the various voltage waveforms in FIG. 7. At first, the reset signal RST, which is one of the input signals to the voltage generator circuit 20, remains at the "H" level, and the signal SBE, which is another input to the circuit 20, remains at the "L" level. Thus, in a delay circuit including $Q_{51}$-$Q_{54}$, the transistor $Q_{52}$ is kept ON, the transistor $Q_{51}$ is kept OFF, the node N21 is kept "L", the transistor $Q_{54}$ is kept OFF and the transistor $Q_{53}$ is kept ON. Therefore, in a driving circuit including $Q_{55}$-$Q_{62}$, the nodes N22 and N23 are kept "H" (accordingly, the gate capacitance of the transistor $Q_{56}$ is charged up), and the transistors $Q_{60}$ and $Q_{62}$ are kept ON. In addition, the node N24 is kept "L", and therefore the transistors $Q_{58}$ and $Q_{61}$ are kept OFF and the nodes N25 and N26 are kept "L". Furthermore, in a bootstrap circuit including $Q_{63}$-$Q_{66}$, the node N27 is kept at the "HH" level, higher than the normal "H" level, due to the bootstrap effect according to the MOS capacitor $Q_{66}$ and the signal RST so that the transistor $Q_{64}$ is kept fully ON. Therefore, the MOS capacitor $Q_{63}$ is charged up at the level of the voltage source $V_{CC}$. Thus, at this stage, the output voltage $V_{BS}$ of the voltage generator circuit 20 is kept at the $V_{CC}$ level.

Under the above-mentioned condition, when the signal RST falls down, the potential of the node N27 falls down to a level lower than the $V_{CC}$ level by the threshold voltage $V_{TH}$ of the transistor $Q_{65}$, and the MOS capacitor $Q_{66}$ is charged up to this potential ($V_{CC} - V_{TH}$) so that any charge lost in the capacitor $Q_{66}$ while the bootstrap effect is being carried out is compensated for. In addition, the output voltage $V_{BS}$ which has been kept at the $V_{CC}$ level becomes disconnected from the voltage source because the transistor $Q_{64}$ is turned OFF. This falling down of the signal RST is effected preceding the rising up of the signal SBE. When the signal SBE rises up after the falling down of the signal RST, the transistor $Q_{51}$ is turned ON, the $Q_{52}$ is kept OFF, the node N21 is turned to "H", the transistor $Q_{54}$ is turned ON, the transistor $Q_{53}$ is kept OFF, the node N22 is forced to "L", the transistors $Q_{55}$, $Q_{60}$ and $Q_{62}$ are turned OFF, and the transistor $Q_{57}$ is kept OFF. Therefore, the node N24 receiving the signal SBE through the transistor $Q_{56}$ being turned ON during a delay period caused by $Q_{51}$-$Q_{54}$ is turned to "H", the transistors $Q_{58}$ and $Q_{61}$ are forced ON, and the nodes N25 and N26 are turned to "H". Since the MOS capacitor $Q_{63}$ is charged up at the voltage source $V_{CC}$ as described above, the output voltage $V_{BS}$ is pushed up above the voltage source $V_{CC}$ as shown in FIG. 7 when the node N26 rises up to the level of $V_{CC}$ due to the bootstrap effect of the MOS capacitor $Q_{59}$.

While in the OBE signal generator circuit 19, when the signal SBE rises up, the transistor $Q_{11}$ is turned ON, the transistor $Q_{12}$ is turned OFF, the node N1 is turned to "H", the transistor $Q_{14}$ is turned ON, and the transistor $Q_{13}$ is turned OFF, and, accordingly, the node N2 falls down to the "L" level. Thus, the transistor $Q_{20}$ and $Q_{22}$ are turned OFF. And at the period between the signal SBE rising and the node N3 being charged, the transistor $Q_{16}$ is kept ON, the transistor $Q_{17}$ is turned OFF, accordingly, the node N4 rises up together with the signal SBE. Accordingly, the transistors $Q_{18}$ and $Q_{21}$ are turned ON and are still more fully turned ON due to the bootstrap effect according to the MOS capacitor $Q_{19}$. Therefore, the levels of the node N5 and the output OBE rise up rapidly above the voltage source $V_{CC}$ following the output voltage $V_{BS}$ which is pushed up to the "HH" level, as shown in FIG. 7. By obtaining the above-mentioned signal OBE, the output voltage OUT of the output buffer circuit 16 having the same construction as that of FIG. 2 outputs an "HH" level almost equal to that of the signal OBE because the transistor $Q_{34}$ is kept ON according to its gate capacity; then the output transistor $Q_{41}$ is fully turned ON and the output $D_{out}$ is raised to an "H" level almost equal to the $V_{CC}$ level.

Figure 2:
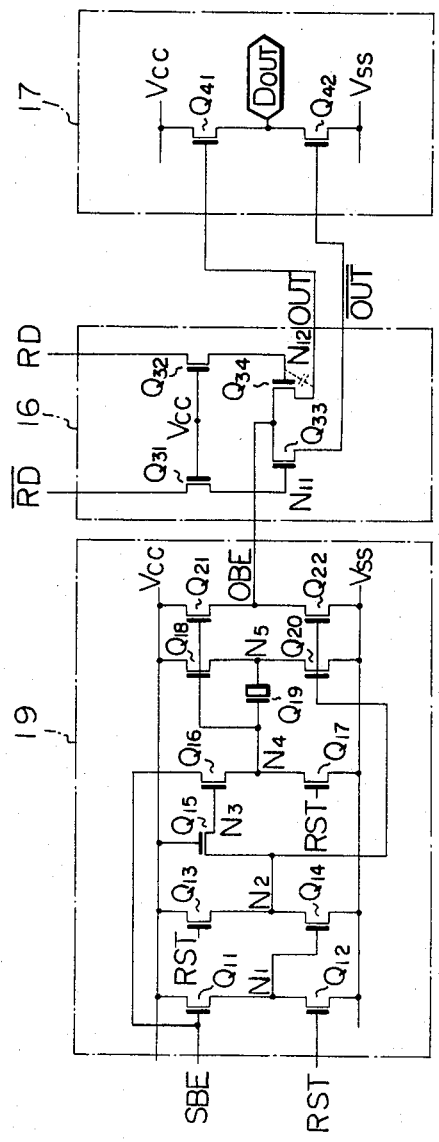
FIG. 2 is a detailed circuit diagram of the OBE signal generator circuit, the output buffer circuit, and the group of output transistors in the device of FIG. 1.
Figure 3:
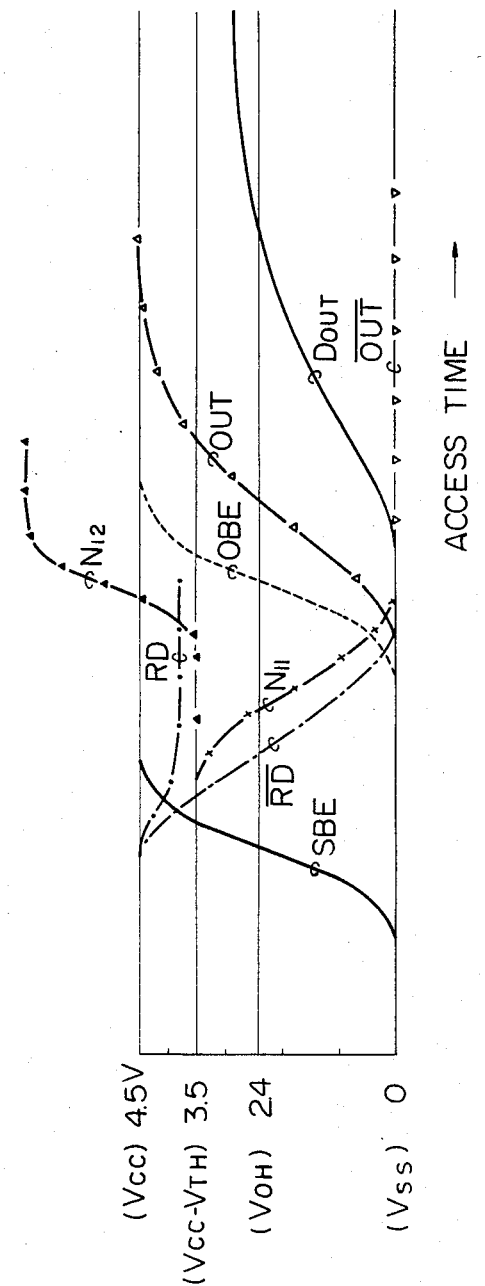
FIG. 3 illustrates various voltage waveforms appearing in the circuit of FIG. 2.

As a way to raise up the output voltage to a level almost equal to the voltage source $V_{CC}$, the bootstrap circuit similar to the circuit using the capacitors $Q_{19}$ and $Q_{59}$ shown in FIG. 2 or FIG. 6 may be utilized. However, such an arrangment is not appropriate, according to the object of the present invention, for speeding up the rising up of the output signal $D_{out}$. That is, in such an arrangement, the MOS capacitors $Q_{19}$ and $Q_{59}$ are first charged up at the arrival of the signal SBE. Then the levels of the nodes N5 and N25 are raised up so that the bootstrap effect is put into action, and the final output voltage rises up to the level of the voltage source $V_{CC}$. Therefore, the time required for the output voltage to reach the voltage source $V_{CC}$ is relatively long. Thus, since the access time of the memory device is long, the above-mentioned arrangement is not appropriate according to the object of the present invention.

While in the circuit of FIG. 6, according to the present invention, the capacitor $Q_{63}$ is charged up preceding the rising up of the signal SBE, the transistor $Q_{64}$ in the charging circuit for the capacitor $Q_{63}$ is turned OFF so that the output terminal $V_{BS}$ is turned to the floating state. Then the output voltage $V_{BS}$ is pushed up through capacitor $Q_{63}$ by the rising of the node N26 in response to the rising of the signal SBE, and the output voltage $V_{BS}$ is increased. Thus, the circuit of FIG. 6 has an advantage in that there is no delay in operation. Since the capacitor $Q_{63}$ is used as a voltage supply responsive to the signal SBE and is necessary to charge up the parasitic capacitance accompanying the signal line SBE, the capacitance of the capacitor $Q_{63}$ should be relatively large. The capacitor $Q_{63}$ has been charged up through the transistor $Q_{64}$ preceding the rising up of the signal SBE, and thus the large capacity of the capacitor $Q_{63}$ does not cause a delay in operation.

As described above, according to the present invention, the "H" level of the data output $D_{out}$ can be made equal to the level of the voltage source $V_{CC}$, and the access time of the memory device can be decreased by speeding up the rising transition of the data output $D_{out}$.

We claim:

1. A semiconductor memory device having a memory cell producing data signals, comprising:
    an output buffer circuit receiving the data signals read out from the memory cell and producing output signals, and having an output stage;
    an output stage MOS transistor, operatively connected to the output stage of said output buffer circuit, being turned ON and OFF according to the output signals of said output buffer circuit;
    an output buffer enable signal generator circuit, operatively connected to the output stage of said output buffer circuit, for generating an output buffer enable signal which is used as a voltage supply to the output stage of said output buffer circuit having a voltage source operatively connected thereto and an output stage transistor operatively connected to said output buffer circuit; and
    a voltage generator circuit, operatively connected to the output stage transistor of said output buffer enable signal generator circuit, for generating a boosting voltage higher than the voltage source preceding the rising up of said output buffer enable signal, said boosting voltage being fed as a voltage supply to the output stage transistor of said output buffer enable signal generator circuit, said output buffer enable signal being formed as a voltage waveform which rises up to a level higher than the voltage source.

2. A semiconductor memory device as claimed in claim 1, wherein said voltage generator circuit includes a bootstrap circuit, operatively connected to the output stage transistor of said output buffer enable signal generator circuit, for generating said boosting voltage higher than the voltage source.

3. A semiconductor memory device as claimed in claim 2,
    wherein said semiconductor memory device is operatively connectable to receive a sense buffer enable signal,
    wherein said voltage generator circuit further includes a driver circuit operatively connected to said bootstrap circuit and operatively connectable to receive said sense buffer enable signal, and wherein said output buffer enable signal generator circuit is driven in response to the sense buffer enable signal, said bootstrap circuit in said voltage generator circuit is driven by said driver circuit, said driver circuit being driven in response to said sense buffer enable signal.

4. A semiconductor memory device as claimed in claim 1, wherein said voltage generator circuit generates said boosting voltage before said output buffer enable signal generator circuit generates said output buffer enable signal.

5. A semiconductor memory device having a memory cell and memory cell sensing means producing data signals, comprising:
    an output buffer circuit, operatively connected to said memory cell sensing means, for producing output signals responsive to the data signals;
    an output transistor circuit, operatively connected to said output buffer circuit, responsive to the output signals;
    an output buffer enable signal generator, operatively connected to a voltage source and said output buffer circuit, for supplying an output buffer enable signal used as a voltage supply signal by said output buffer circuit and comprising an output stage transistor operatively connected to said output buffer circuit; and
    voltage boosting means, operatively connected to said output buffer enable signal generator, for boosting the voltage supply signal to a voltage value above the voltage value of the voltage source, and comprising:
        a bootstrap circuit operatively connected to said output stage transistor;
        a driving circuit operatively connected to said bootstrap circuit; and
        a delay circuit operatively connected to said driving circuit, so that said output signals are produced having a voltage value above the voltage value of said voltage source.

6. A semiconductor memory device having a memory cell and an output terminal, comprising:
    an output buffer circuit for receiving data signals read out from the memory cell and delivering complementary output signals;
    an output buffer stage having a first MOS transistor including a gate receiving a one of said complementary output signals and a drain connected to a first supply voltage, and a second MOS transistor including a gate receiving the other of said complementary output signals and a source connected to a second supply voltage lower than the first supply voltage, a junction between a source of said first MOS transistor and a drain of said second MOS transistor being connected to the output terminal of said semiconductor memory device, the potential of the one of said complementary output signals is higher than the first supply voltage and a potential of the output terminal of said semiconductor memory device is the first supply voltage.

7. A semiconductor memory device, comprising:
    a first voltage supply;
    a second voltage supply lower than said first voltage supply;
    a signal generator circuit for delivering an output signal to an output terminal which is higher than the first supply voltage in response to an input signal;

a voltage generator circuit for supplying a boosted voltage to a boosted voltage terminal which is higher than the first supply voltage supplied to said signal generator circuit;

said signal generator circuit including an output stage having a first transistor connected to the second voltage supply and a second transistor for receiving the boosted voltage produced by said voltage generator circuit, a junction being formed between the first and second transistors and being connected to the output terminal of said signal generator circuit; and said voltage generator circuit including an output portion having a pushing-up capacitor having a first electrode connected to the boosted voltage terminal and is operable to push up the boosted voltage to a potential higher than the first supply voltage, a charging transistor turned on prior to the rise of the potential of the output terminal of said signal generator circuit to charge said pushing-up capacitor with the first supply voltage, and turned off to disconnect said pushing-up capacitor from the first supply voltage when the potential of the output terminal of said signal generator circuit is raised, and a transistor for supplying a clock signal to a second electrode of said pushing-up capacitor when the potential of the output terminal of said signal generator circuit is raised.

* * * * *

UNITED STATES PATENT AND TRADEMARK OFFICE
CERTIFICATE OF CORRECTION

PATENT NO. : 4,532,613

DATED : July 30, 1985

INVENTOR(S) : YOSHIHIRO TAKEMAE ET AL.

It is certified that error appears in the above-identified patent and that said Letters Patent is hereby corrected as shown below:

Col. 1, line 13, ";" should be --and--.

In Fig. 2 a node dot should be located between transistors $Q_{15}$ and $Q_{16}$ on gate line of transistor $Q_{16}$. This node dot has the label $N_3$.

Signed and Sealed this

Twenty-fifth Day of March 1986

[SEAL]

Attest:

DONALD J. QUIGG

Attesting Officer  Commissioner of Patents and Trademarks